(12) United States Patent
Theissen et al.

(10) Patent No.: US 6,566,898 B2
(45) Date of Patent: *May 20, 2003

(54) TEMPERATURE COMPENSATED VERTICAL PIN PROBING DEVICE

(75) Inventors: William F. Theissen, Newtown, CT (US); Stephen Evans, Newtown, CT (US); Francis T. McQuade, Watertown, CT (US); Zbigniew Kukielka, Plainville, CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/953,599

(22) Filed: Sep. 17, 2001

(65) Prior Publication Data

US 2002/0011858 A1 Jan. 31, 2002

Related U.S. Application Data

(63) Continuation-in-part of application No. 09/519,363, filed on Mar. 6, 2000.

(51) Int. Cl.$^7$ ............................................... G01R 31/02
(52) U.S. Cl. ........................................ 324/754; 324/761
(58) Field of Search ............................. 324/754, 755, 324/761, 762; 439/480, 482, 824

(56) References Cited

U.S. PATENT DOCUMENTS

| | | | |
|---|---|---|---|
| 3,930,809 A | 1/1976 | Evans | 29/203 J |
| 4,382,228 A | 5/1983 | Evans | 324/158 F |
| 4,599,559 A | 7/1986 | Evans | 324/158 P |
| 4,719,417 A | 1/1988 | Evans | 324/158 P |
| 4,975,638 A | 12/1990 | Evans et al. | 324/158 P |
| 5,323,105 A | 6/1994 | Davis, Jr. et al. | 324/158 |
| 5,355,079 A | 10/1994 | Evans et al. | 324/754 |
| 5,416,429 A | 5/1995 | McQuade et al. | 324/762 |
| 5,442,299 A | 8/1995 | Caggiano | 324/758 |
| 5,623,213 A | 4/1997 | Liu et al. | 324/754 |
| 5,670,889 A | 9/1997 | Okubo et al. | 324/760 |
| 5,691,651 A | 11/1997 | Ehlermann | 324/760 |
| 5,841,291 A | 11/1998 | Liu et al. | 324/755 |
| 5,854,558 A | 12/1998 | Motooka et al. | 324/754 |
| 5,952,843 A | 9/1999 | Vinh | 324/761 |
| 5,955,888 A | 9/1999 | Federickson et al. | 324/761 |
| 5,959,461 A | 9/1999 | Brown et al. | 324/765 |
| 5,973,504 A | 10/1999 | Chong | 324/754 |
| 5,977,787 A * | 11/1999 | Das et al. | 324/761 |
| 6,005,401 A | 12/1999 | Nakata et al. | 324/754 |
| 6,031,383 A | 2/2000 | Streib et al. | 324/754 |
| 6,124,723 A | 9/2000 | Costello | 324/762 |
| 6,160,412 A | 12/2000 | Martel et al. | 324/761 |
| 6,163,162 A * | 12/2000 | Thiessen et al. | 324/761 |
| 6,255,602 B1 | 7/2001 | Evans et al. | 174/262 |
| 6,297,657 B1 | 10/2001 | Thiessen et al. | 324/761 |

OTHER PUBLICATIONS

International Search Report(PCT/US 01/06437).

* cited by examiner

*Primary Examiner*—Vinh P. Nguyen
(74) *Attorney, Agent, or Firm*—Todd E. Garabedian; Gregory S. Rosenblatt; Wiggin & Dana LLP

(57) ABSTRACT

An improved vertical pin probing device is constructed with a housing with spaced upper and lower spacers of Invar®, each having a thin sheet of silicon nitride ceramic material held in a window in the spacer by adhesive. The Invar spacers may be composed of Invar foils adhered to one another in a laminated structure. The sheets of silicon nitride have laser-drilled matching patterns of holes supporting probe pins and insulating the probe pins from the housing. The Invar spacers and silicon nitride ceramic sheets have coefficients of thermal expansion closely matching that of the silicon chip being probed, so that the probing device compensates for temperature variations over a large range of probing temperatures.

17 Claims, 3 Drawing Sheets

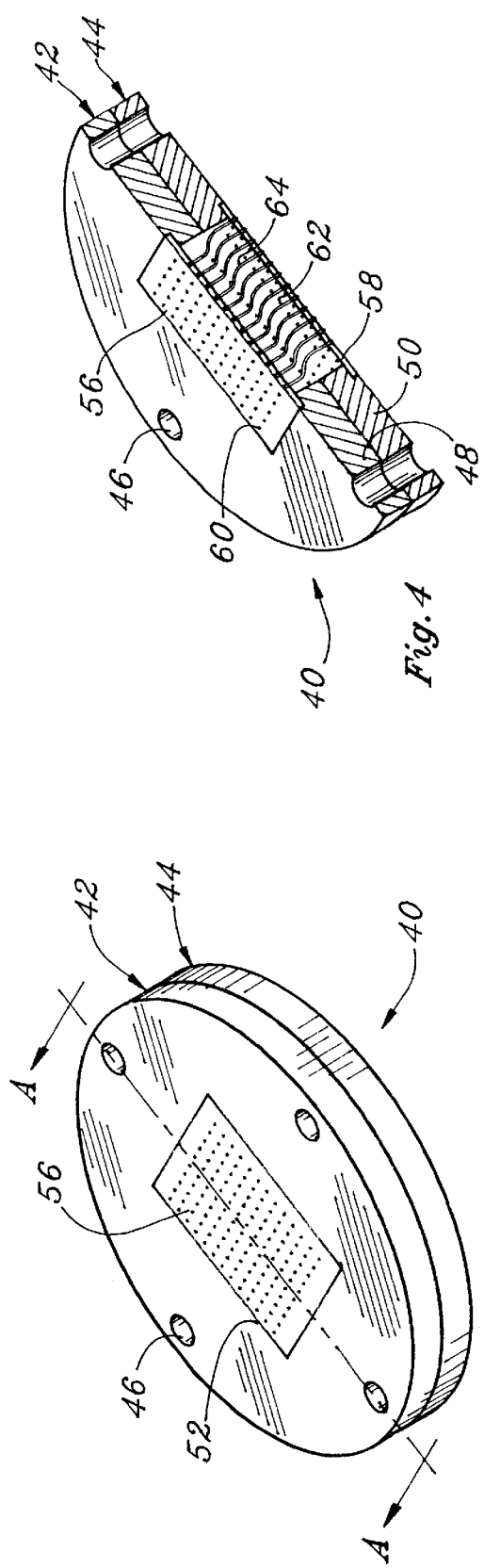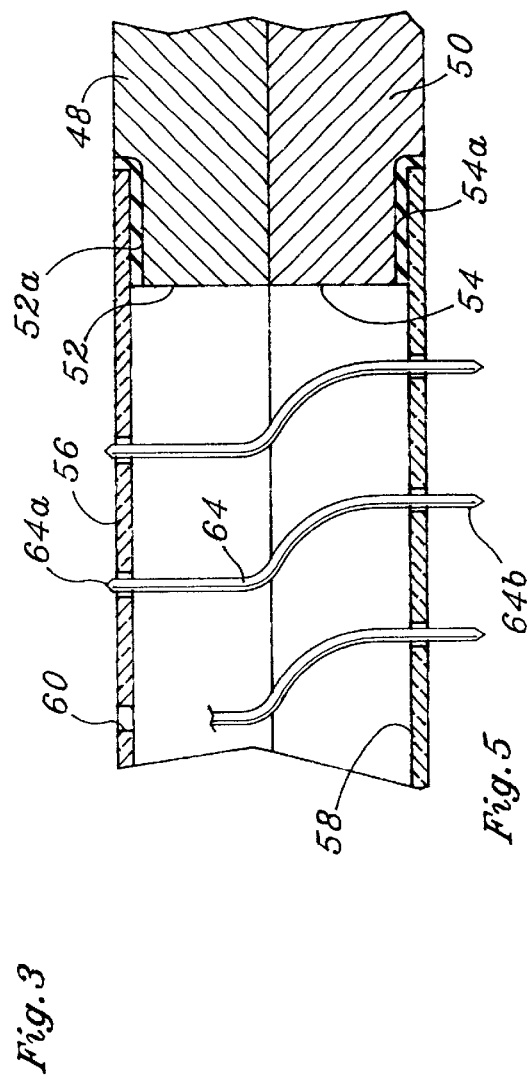

TEMPERATURE COMPENSATED VERTICAL PIN PROBING DEVICE

CROSS REFERENCE TO RELATED APPLICATIONS

Figure 1:
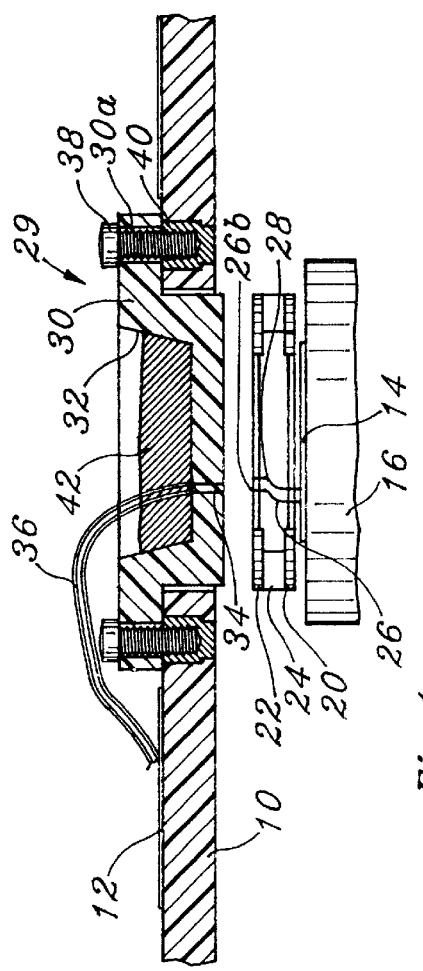

This is a continuation-in-part of U.S. Application Ser. No. 09/519,363 filed Mar. 6, 2000, Confirmation No. 7711.

BACKGROUND OF THE INVENTION

This invention relates to an improved temperature compensated vertical pin probing device for probing integrated circuits over a large temperature range.

Integrated circuits in their wafer state are tested using probing devices, the probes of which are traditionally of cantilevered or vertical configuration. In a known type of vertical pin probing device, the probes are held between spaced upper and lower dies and are generally curved with a straight portion that protrudes substantially perpendicular through the lower die of the housing. As the wafer under test is raised into contact with the probing device, and then overdriven a few thousandths of an inch, the probes recede into the housing, and the curved portion of the probe deflects causing spring force that provides good electrical contact with the integrated circuit pads.

Traditionally, the housing is made from a dielectric material, often a plastic such as Delrin®, trademark of E. I. duPont de Nemours & Co.

When a certain IC (integrated circuit) is tested at two or more temperatures, over a large temperature range, for example 32 degrees F., room temperature, and 275 degrees F., the typical prior art probe housing expands with a significantly higher thermal expansion rate than that of the silicon base material of the IC wafer under test. Such expansion causes a mismatch of the probe locations and the IC pad locations, a condition that not only results in failure to make satisfactory electrical contact, but may result in fatal damage to the IC due to probe penetration in the circuit region of the IC.

One solution to this problem is to dimensionally compensate the room temperature pitch dimensions of probes in the housing so that at the specified test temperature it will have expanded to provide a nearly exact match of probe and pad positions. Except for temperatures within a narrow range, this option requires separate probe devices for each specific temperature, thus greatly increasing the user's monetary investment in probe devices.

Another solution would be to find a plastic or other suitable dielectric that matches the coefficient of thermal expansion of the silicon wafer. To date, however, the most practical choices of dielectric materials have expansion rates much higher than silicon. Plastics generally have a limited high temperature capability, thereby preventing their uses for high temperature probing of IC's.

One suggestion for temperature compensation of a vertical pin probing device is disclosed in co-pending application Ser. No. 09/228,017 filed Jan. 11, 1999 in the names of W. Thiessen and A. Evans and assigned to the present assignee. That application suggested a probe comprising a pair of spacer members of Invar metal alloy, which has a coefficient of thermal expansion roughly equivalent to that of the silicon chip being probed. The spacer members had recesses supporting opposed channel-shaped insulating inserts of Vespel resin or Macor ceramic. The Macor ceramic had a coefficient of thermal expansion significantly greater than that of the silicon chip, and required an anti-stick coating to provide the requisite lubricity to allow the probe pins to slide in the holes in the inserts. The assembly of the channel members in the recesses and subsequent drilling of the probe pin holes was a cumbersome process.

Another construction is disclosed in co-pending application Ser. No. 09/228,016 filed Jan. 11, 1999 and also assigned to the present assignee. That application discloses a laminated structure of thin metal alloy foils of Invar used to support the probe pins in solid Invar spacers, which have a coefficient of thermal expansion more closely matching that of the silicon. However, the foils are conductive and require an insulating coating to provide electrical insulation and lubricity.

It would be desirable to have a probe with all components more closely matching the coefficient of thermal expansion of the silicon chip, which is simple and easy to construct, does not require added coatings and which is suitable for high temperature probing and probing over a large temperature range.

Accordingly, one object of the present invention is to provide a temperature compensated vertical pin probing device for probing integrated circuits over a large temperature range.

Another object of the invention is to provide a vertical pin probing device which does not require application of special coatings to insulate or provide lubricity.

Another object of the invention is to provide an improved vertical pin probing device suitable for probing integrated circuits at very high temperatures, which is simple to construct.

SUMMARY OF THE INVENTION

Briefly stated, the invention comprises an improved temperature compensated vertical pin probing device for probing integrated circuits over a large temperature range, the integrated circuits having spaced contact pads on a circuit substrate to be contacted by probe pins for testing, the probing device being of a known type comprising upper and lower dies with upper and lower patterns of holes therethrough corresponding to the integrated circuit contact pad spacing at a preselected temperature, and a plurality of probe pins, each pin being disposed in a pair of upper and lower holes and extending beyond the lower die to terminate in a probe tip, the improvement comprising a die member comprising a spacer member with a coefficient of thermal expansion substantially matching that of the circuit substrate, said spacer member defining an aperture, a thin sheet of ceramic material covering said aperture with a coefficient of thermal expansion substantially matching that of the substrate, an adhesive securing the sheet of ceramic material over the aperture, the ceramic sheet defining a plurality of holes therethrough forming one of said upper and lower patterns of holes. Preferably the ceramic material is silicon nitride. The spacer member is preferably of Invar, either formed of a solid piece of Invar or a laminated structure of Invar foils.

DRAWING

Figure 2:
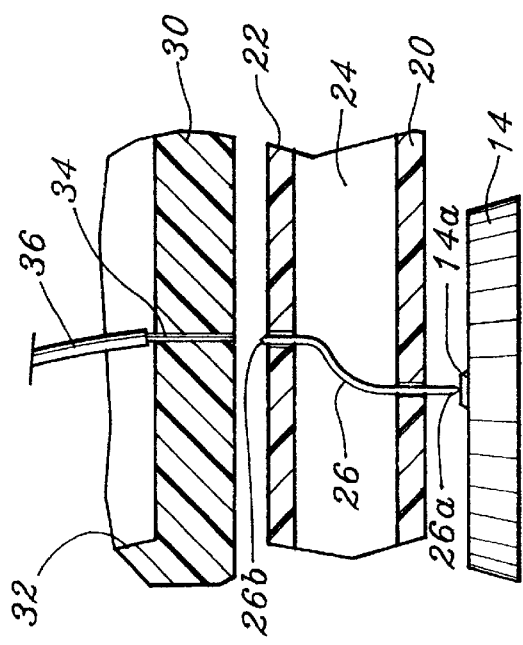

The subject matter, which is regarded as the invention, is particularly pointed out and distinctly claimed in the concluding portion of the specification. The invention, however, both as to organization and method of practice, together with further objects and advantages thereof, may best be understood by reference to the following description, taken in connection with the accompanying drawings, in which:

FIG. 1 is an elevational drawing in cross section showing a prior art vertical pin probing device, together with portions of a printed circuit test board and wired interface and portions of a silicon wafer and chuck support, FIG. 2 is an enlarged side elevational view in cross section showing details of the FIG. 1 prior art vertical pin probing device construction for two probe pins, FIG. 3 is a perspective view of the improved vertical pin probing device according to the present invention, using solid spacers, FIG. 4 is a perspective view showing a cross section through the probing device, taken along lines A—A of FIG. 3, and FIG. 5 is an enlarged and exploded side elevational view in cross section illustrating portions of the probing device of FIGS. 3 and 4.

Figure 7:
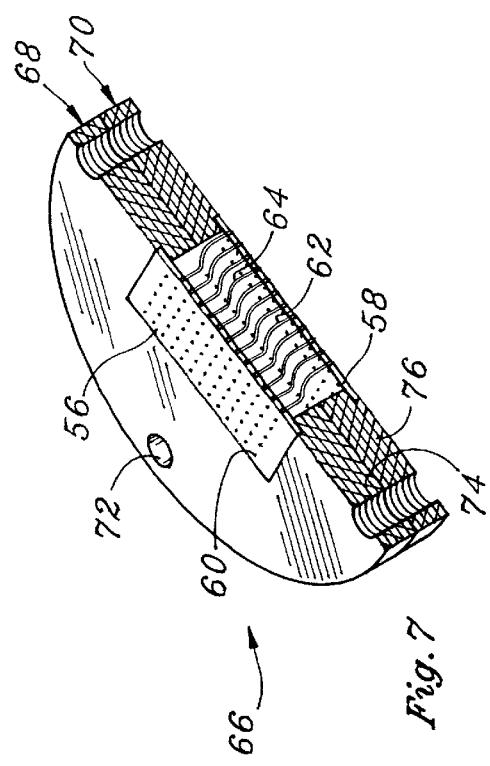
Figure 6:
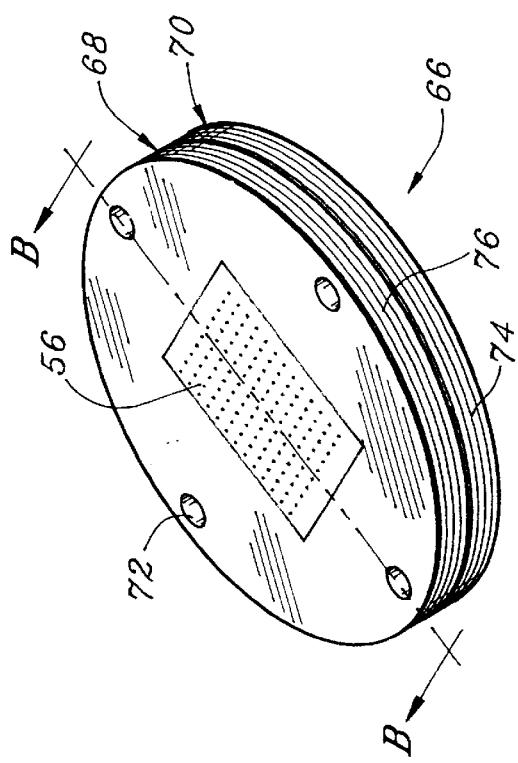
Figure 8:
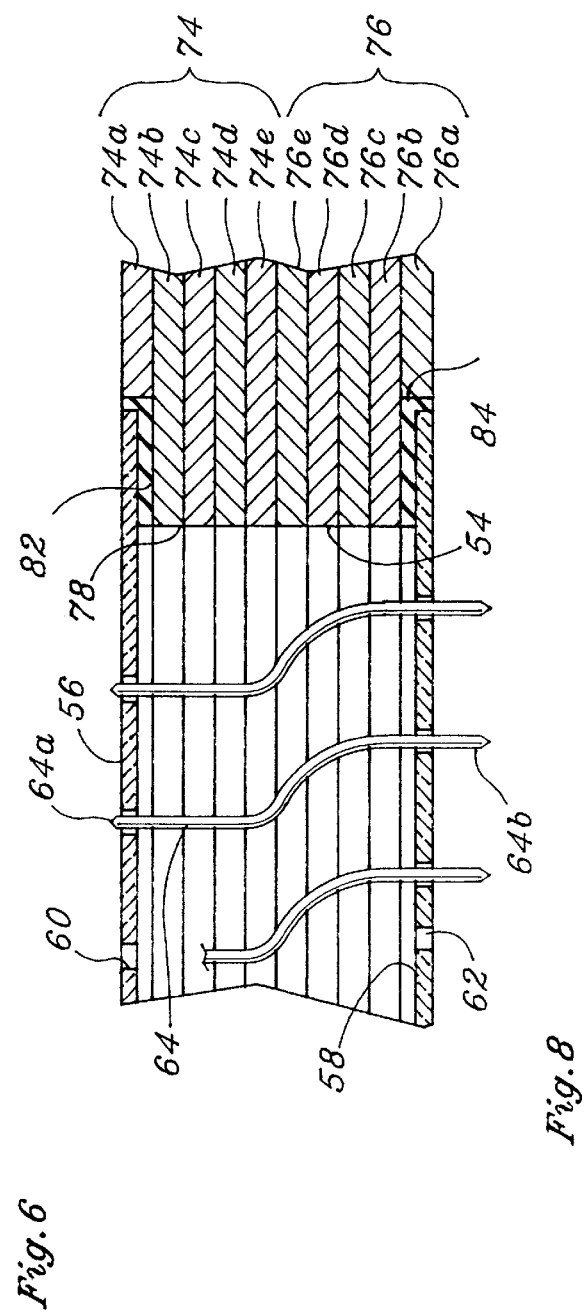

FIGS. 6–8 are views corresponding to FIGS. 3–5 respectively, but showing a modified construction of the vertical pin probing device using a laminated spacer construction.

DETAILED DESCRIPTION OF THE DRAWINGS

Before describing the improvements of the present invention, reference should be made to FIGS. 1 and 2 of the drawing illustrating a prior art vertical pin probing device used with an interconnecting device called a "space transformer" and a printed circuit board. The simplified view of FIG. 1 illustrates a prior art construction. A printed circuit test board 10 sometimes called a "probe card" includes conductive traces 12 which are connected in test circuit relationship to integrated circuit test equipment (not shown). In practice, the traces 12 lead to "pogo pads" on the printed circuit board, to which the external test equipment leads are connected in a prescribed test. An integrated circuit 14 or other device under test is supported on a moveable chuck 16. Integrated circuit 14 typically has a pattern or matrix of contact pads to be simultaneously probed by a vertical-pin integrated circuit probing device 18, such as the COBRA® probe head sold by Wentworth Laboratories. As shown in FIGS. 1 and 2, probing device 18 includes a lower die 20 with a group of holes 21 and upper die 22 with a group of holes 23 separated by a spacer 24 and carrying multiple vertical pin probes 26, 28. The die materials are typically made of a plastic insulating material such as Delrin®, an acetyl resin manufactured by E. I. duPont de Nemours & Co.

Reference to the enlarged cross-section view FIG. 2 illustrates that the two representative probes 26, 28 include probe tips 26a, 28a respectively protruding from holes 21 in the lower face of lower die 20 and exposed heads 26b, 28b respectively protruding from holes 23 in the upper side of upper die 22. The holes 21, 23 containing the opposite ends of the vertical probe pins 26, 28 are slightly offset from one another and the probe pins are curved in a snake-like configuration to promote buckling, so as to create substantially uniform contact pressure on the integrated circuit pads 14a, 14b despite any slight vertical unevenness or misalignment.

A prior art space transformer shown in FIG. 1 is indicated generally at 29 and comprises a mounting block 30 with a well 32 formed therein. At the bottom of the well, a number of holes 34 are laid out to dimensionally correspond to a first small inner pattern defined by the exposed heads 26b of the probe head assembly 18. The probing assembly 18 is shown separated from the space transformer 29 for clarity but is connected thereto in actual operation by screws (not shown).

An individual insulated wire 36 is connected to PCB trace 12 at one end and on the other end, the wire extends into a hole 34 in the mounting block 30 so as to be in electrical contact with probe head 26b on the underside of block 30 when the probe assembly 18 is bolted to the space transformer 29. A similar wire 37 cooperates with probe head 28b.

Space transformer 29 is attached to the PC board by means such as screws 38, and an epoxy potting compound 39 immobilizes wires 36, 37. The probing device 18 is attached to the underside of space transformer 29 by screws (not shown), so that probe heads 26b, 28b make electrical contact with leads 36, 37. The integrated circuit 14 has a number of spaced contact pads, such as 14a, 14b, spaced apart by dimension A. The probe tips 26a, 26b are spaced apart by dimension B. Prior art devices in which the coefficient of thermal expansion of the die material is substantially different from the coefficient of thermal expansion of the silicon wafer (0.00000156 inches per inch per degree F. or 0.0000028 meters per meter per degree Kelvin) will result in a mismatch between dimensions A and B to a degree which depends on the temperature range of probing.

Referring now to FIGS. 3, 4, and 5 of the drawing, the improved temperature compensated vertical pin probing device is indicated generally by reference numeral 40 and comprises an upper die member 42 and a lower die member 44. The dies are held together and mounted to the mounting block 30 shown in FIG. 1 by means of screws (not shown) passing through suitably placed holes 46 around the perimeter. Each of the upper and lower die members 42, 44 includes a spacer member 48, 50 respectively with a rectangular aperture 52, 54 respectively. Each aperture 52, 54 is covered by a thin ceramic sheet 56, 58 respectively. The spacer members 48, 50 are fabricated from a substrate core material having a coefficient of thermal expansion as close as possible to that of the silicon making up the circuit substrate. One preferred material is a nickel metal alloy of Invar®, (registered trademark of Imphy S.A.) having a coefficient of thermal expansion of 0.00000100 inches per degree F. (or 0.0000018 meters per meter per degree Kelvin) at a nominal composition of 36% nickel, which is slightly less than that of silicon. The thermal coefficient of expansion may be varied so as to coincide exactly with that of silicon, if desired, by adjusting the percentage of nickel in the alloy as known in the art. (Sisco, Modern Metallurgy for Engineers, $2^{nd}$ Edition, p. 299).

As previously known in the art, probe pins 64 extend between the pattern of spaced and offset holes 60, 62 in the ceramic sheets 56, 58 supported by spacer members 48, 50 of upper and lower die members 42, 44 respectively. The upper ends of the probe pins 64 terminate in probe tips 64a which are disposed and make electrical contact with the wires such as 37 (FIG. 1) leading to the printed circuit test board. The lower ends of the probe pins 64 terminate in probe tips 64b which slide in holes 62 in known manner during probing of wafer 14 (FIG. 1).

Referring to the cross section of FIG. 4 taken along lines A—A of FIG. 3, it is seen that the periphery of the upper ceramic sheet 56 is mounted on the upper surface of spacer member 48 and the lower ceramic sheet 58 is mounted on the lower surface of spacer member 50, so that the two ceramic sheets are held apart in spaced relationship. The upper ceramic sheet 56 contains a plurality of holes 60 drilled by laser in a predetermined upper pattern of holes. The lower ceramic sheet 58 contains a plurality of holes 62 similarly drilled by laser in the same predetermined pattern, except that the pattern is offset from the upper pattern in the plane of the ceramic sheet to provide a lower pattern of holes. This provides upper and lower holes which are laterally offset from one another, in pairs.

Reference to the enlarged cross sectional drawing of FIG. 5, which is not to scale, illustrates a portion of the probe assembly 40. Aperture 52 in spacer 48 is enlarged about its periphery in the upper face to provide a ledge 52a, and a similar peripheral ledge 54a is provided in the lower face of spacer member 50. The upper ceramic sheet 56 is relatively thin (10 mils) and the lower ceramic sheet is also relatively thin, but thicker than the upper sheet, having a preferred dimension of about 20 mils in thickness. The ceramic sheets 56, 58 are mounted to cover the apertures 52, 54 on ledges 52a, 54a respectively by means of a high strength rigid adhesive such as epoxy.

In accordance with the present invention, we have discovered that silicon nitride ceramic is ideally suited for the ceramic sheets used in the improved vertical pin probing device. Silicon nitride ceramics offer high mechanical strength at elevated temperatures, thermal shock resistance and toughness as well as having a low coefficient of friction to enable sliding of the probe pins without the necessity of a coating of anti-stick material. The silicon nitride sheet is normally produced by hot pressing and is a two phase, alpha and beta, polycrystalline ceramic. It has a coefficient of thermal expansion of $1.7 \times 10^{-6}$ inches per inch per degree F. (or 0.0000034 meters per meter per degree Kelvin), which is only slightly greater than the coefficient of thermal expansion of silicon. Since the thermal coefficient of the spacer member is slightly less than that of silicon and the thermal coefficient of silicon nitride is slightly greater than that of silicon, the two materials used in the die member cooperate with one another to cause the overall thermal coefficient of the die member to closely approximate that of the silicon wafer.

Modification

A modified form of the invention is seen in FIGS. 6, 7 and 8 which correspond to FIGS. 3, 4 and 5 respectively. Rather than using a spacer member of solid Invar, we have found that a laminated Invar spacer offers significant advantages in terms of ease of construction and improved performance over the solid Invar spacers 48, 50 shown in FIGS. 3–5.

Referring to FIGS. 6–8 of the drawing, a modified temperature compensated vertical pin probing device is indicated generally by reference numeral 66 comprising an upper die member 68 and a lower die member 70. The dies are held together as previously described by screws (not shown) passing through suitably placed holes 72 around the perimeter. Upper and lower die members 68, 70 include an upper spacer member 74 and a lower spacer member 76, respectively provided with rectangular apertures 78, 80 respectively. Each aperture 78, 80 is covered by a thin ceramic sheet 56, 58 respectively, which may be the same as previously described in connection with FIGS. 3–5.

The spacer members 74, 76 are fabricated by chemically etching them from Invar foil, and adhering the laminations together with an adhesive. Upper spacer 74 is composed of laminations 74a, 74b, 74c, 74d, 74e, and lower spacer 76 is composed of laminations 76a, 76b, 76c, 76d, 76e. The laminations or foils are bonded together in a laminated structure. A suitable adhesive is 3M structural adhesive #2290, which is sprayed on and bonds under heat and pressure. The support holes 72 may be etched at the same time as the central hole or aperture is etched in the lamination, which greatly facilitates the construction and avoids drilling holes through solid Ivar as in the construction of FIGS. 3–5. A suitable thickness for Invar foils used to make the laminated spacers 74 and 76 is 10 mils. This requires a stack of approximately 4 to 6 foils in a typical application to make a spacer.

As previously known in the art, probe pins 64 extend between the pattern of spaced and offset holes 60, 62 in the ceramic sheets 56, 58. The upper ends of the probe pins 64 terminate in probe pin tips 64a which are disposed and make electrical contact with the wires such as 37 (FIG. 1) leading to the printed circuit test board. The lower ends of the probe pins 64 terminate in probe tips 64b which slide in holes 62 in a known manner during probing of wafer 14 (FIG. 1).

Referring to cross section of FIG. 7, taken along lines B—B of FIG. 6, it is seen that upper ceramic sheet 56 is mounted on the upper side of spacer member 74 and the lower ceramic sheet 58 is mounted on the lower side of spacer member 76, so that the two ceramic sheets are held apart in spaced relationship. The upper and lower ceramic sheets 56, 58 are drilled to provide upper and lower patterns of holes 60, 62 respectively. The patterns are identical except that the upper pattern is offset from the lower pattern, as before.

Referring to the enlarged cross sectional drawing of FIG. 8 (which is not to scale) a portion of the probe assembly is illustrated. The top lamination 74a is etched to provide a larger opening that the underlying laminations 74b, 74c, 74d, 74e, so as to provide a peripheral recess for receiving ceramic sheet 56. The bottom lamination 76a is etched with larger openings than 76b, 76c, 76d, 76e to provide a recess for ceramic sheet 58.

The etching process is an easier way to create peripheral ledges to retain the ceramic sheets than machining solid Invar block spacers as used in FIGS. 3–5. The ceramic sheets 56, 58 are held in the recesses by adhesive at 82, 84. A suitable adhesive is the 3M Structural Adhesive #2290 or a high strength rigid epoxy adhesive.

Operation

The operation of the invention may be described as follows. Since the Invar material has a coefficient of thermal expansion slightly lower than, but substantially matching, that of the silicon, the Invar upper and lower dies expand substantially so as to dimensionally correspond to the expansion of the silicon wafer. Therefore the location of the centerlines of ceramic sheets 56, 58 and holes 60, 62 are located in accordance with the contact pads on the silicon wafer, and follow the expansion and contraction of the silicon wafer.

The ceramic sheets 56, 58 may expand and contract about their own centerlines with a slightly higher coefficient of thermal expansion than the silicon wafer and the spacer members 48, 50 (or 74, 76). However, the inserts are restrained by the adhesive and only permitted to expand in a direction perpendicular to the plane of the wafer. Therefore, despite the fact that the coefficient of thermal expansion of the insulated inserts may be slightly higher than that of the silicon wafer, it does not cause any significant mismatch between wafer contact pads and probe points over a large temperature range. The lubricity provided by the preferred ceramic material allows the probe pins to slide without requiring an anti-stick coating.

While there has been described what is considered to be the preferred embodiment of the invention and one modification thereof, other modifications will occur to those skilled in the art, and it is desired to secure in the appended claims all such modifications as fall within the true spirit and scope of the invention.

What is claimed is:

1. An improved temperature compensated vertical pin probing device for probing integrated circuits over a large temperature range, the integrated circuits having spaced contact pads located on a circuit substrate to be contacted by probe pins for testing, the probing device being of a known type comprising upper and lower spaced die members respectively defining upper and lower patterns of holes therethrough corresponding to the integrated circuit contact pad spacing at a preselected temperature, and a plurality of probe pins, each pin being disposed in a pair of upper and lower holes and extending beyond the lower die to terminate in a probe tip, the improvement comprising each of said upper and lower spaced die members having a spacer member, each of said spacer members comprised of a laminated structure with a coefficient of thermal expansion substantially matching that of the circuit substrate, each spacer member having an aperture therethrough, a thin sheet of ceramic material disposed over said aperture with a coefficient of thermal expansion substantially matching that of the circuit substrate, and an adhesive securing the sheet of ceramic material over said aperture, each sheet having a plurality of holes therethrough forming one of said upper and lower patterns of holes.

2. The improvement according to claim 1, wherein the coefficients of thermal expansion of the spacer member and the sheet of ceramic material are respectively slightly lower than and slightly higher than the coefficient of thermal expansion of silicon.

3. The improvement according to claim 2, wherein said spacer member is of Invar metal alloy.

4. The improvement according to claim 2, wherein said ceramic sheet is silicon nitride.

5. The improvement according to claim 1, wherein the spacer member has a surface surrounding the aperture and defines a peripheral ledge adjacent the surface, said sheet of ceramic material having a periphery disposed on said peripheral ledge.

6. The improvement according to claim 5, wherein the adhesive is epoxy resin and secures the periphery of the sheet of ceramic material to said peripheral ledge.

7. The improvement according to claim 1, wherein the spacer member is of Invar metal alloy, and the sheet of ceramic material is of silicon nitride.

8. An improved temperature compensated vertical pin probing device for probing integrated circuits over a large temperature range, the integrated circuits having spaced contact pads located on a circuit substrate to be contacted by probe pins for testing, the probing device being of a known type comprising upper and lower spaced die members respectively defining upper and lower patterns of holes therethrough corresponding to the integrated circuit contact pad spacing at a preselected temperature, and a plurality of probe pins, each pin being disposed in a pair of upper and lower holes and extending beyond the lower die to terminate in a probe tip, the improvement comprising each of the upper and lower spaced die members having a spacer member with a coefficient of thermal expansion substantially matching that of the circuit substrate, each of said spacer member comprising a laminated structure of Invar metal alloy foils and defining an aperture therethrough, a thin sheet of silicon nitride covering each of said apertures and an adhesive securing the sheet of silicon nitride over each of said aperture and to one of said spacer members, each of said sheets having a plurality of holes therethrough forming one of said upper and lower patterns of holes.

9. The improvement according to claim 8, wherein there are two of said die members disposed adjacent one another with said thin sheets of silicon nitride spaced from one another and said spacer members contacting one another, to provide said upper and lower die members.

10. The improvement according to claim 8, wherein said laminated structure comprises a plurality of Invar metal foils each having a thickness on the order of 10 mils.

11. A temperature compensated vertical pin probing device for testing integrated circuits over a range of temperatures, each of said integrated circuits having contact pads disposed on a circuit substrate, said probing device comprising:

an upper die member including an upper spacer with a coefficient of thermal expansion substantially matching that of said circuit substrate, said upper spacer having an aperture therethrough;

a first sheet of ceramic material disposed over said aperture of said upper spacer, said first sheet having a coefficient of thermal expansion substantially matching that of said circuit substrate, said first sheet having a first pattern of holes therethrough;

a lower die member including a lower spacer with a coefficient of thermal expansion substantially matching that of said circuit substrate, said lower spacer having an aperture therethrough;

a second sheet of ceramic material disposed over said aperture of said lower spacer, said second sheet having a coefficient of thermal expansion substantially matching that of said circuit substrate, said second sheet having a second pattern of holes therethrough;

wherein said first and said second patterns of holes correspond to spacing, at a preselected temperature, of said integrated circuit contact pads and wherein said second pattern of holes are laterally offset from said first pattern of holes; and a plurality of probe pins each having an upper portion and a lower portion, wherein each of said plurality of probe pins is disposed in a pair of holes such that one hole of said first pattern of holes secures said upper portion of a corresponding probe pin and one hole of said second pattern of holes secures said lower portion of said corresponding probe pin and wherein said lower portion of said corresponding probe pin extends beyond said lower die member for contacting one of said contact pads.

12. The temperature compensated vertical pin probing device of claim 11, wherein each of said spacer members is comprised of a solid metal alloy.

13. The temperature compensated vertical pin probing device of claim 12, wherein said solid metal alloy spacer member is comprised of Invar metal alloy.

14. The temperature compensated vertical pin probing device of claim 11, wherein each of said spacer members is comprised of a laminated structure.

15. The temperature compensated vertical pin probing device of claim 14, wherein said laminated structure comprises a plurality of Invar metal foils each having a thickness of about 10 mils.

16. A method for testing integrated circuits over a range of temperatures, each of the integrated circuits having a plurality of contact pads disposed on a circuit substrate, the method comprising:

providing a printed circuit test board;

providing a temperature compensated vertical pin probing device electrically coupled to the printed circuit test board, the pin probing device comprising:

an upper die member including an upper spacer with a coefficient of thermal expansion substantially matching that of the circuit substrate, the upper spacer having an aperture therethrough;

a first sheet of ceramic material disposed over the aperture of said upper spacer, the first sheet having a coefficient of thermal expansion substantially matching that of the circuit substrate, the first sheet having a first pattern of holes therethrough;

a lower die member including a lower spacer with a coefficient of thermal expansion substantially matching that of the circuit substrate, the lower spacer having an aperture therethrough;

a second sheet of ceramic material disposed over the aperture of the lower spacer, the second sheet having a coefficient of thermal expansion substantially matching that of the circuit substrate, the second sheet having a second pattern of holes therethrough;

wherein the first and the second patterns of holes correspond to spacing, at a preselected temperature, of the integrated circuit contact pads and wherein the second pattern of holes are laterally offset from the first pattern of holes; and a plurality of probe pins each having an upper portion and a lower portion, wherein each of the plurality of probe pins is disposed in a pair of holes such that one hole of the first pattern of holes receives the upper portion of a corresponding probe pin and one hole of the second pattern of holes receiving the lower portion of the corresponding probe pin, and wherein the upper portion of the corresponding probe pin is electrically coupled to the printed circuit test board and the lower portion of the corresponding probe pin extends beyond the lower die member; and establishing electrical contact between the lower portions of the plurality of probe pins and the plurality of contact pads of an integrated circuit under test;

wherein during testing over the range of temperatures, the upper and lower spacers, the first and second sheets of ceramic material and the integrated circuit under test expand and contract in a substantially matching dimensional manner for avoiding a mismatch of contact between the plurality of probe pins and the plurality of contact pads.

17. The method of testing integrated circuits of claim 16, wherein the first and second sheets of ceramic material are restrained within the aperture such that, over the range of temperatures, the first and the second sheets expand and contract in a direction perpendicular to a plane of the integrated circuit under test.

\* \* \* \* \*

UNITED STATES PATENT AND TRADEMARK OFFICE
CERTIFICATE OF CORRECTION

PATENT NO.   : 6,566,898 B2
DATED        : May 20, 2003
INVENTOR(S)  : William F. Thiessen et al.

It is certified that error appears in the above-identified patent and that said Letters Patent is hereby corrected as shown below:

<u>Title page,</u>
Items [12] and [75], "Theissen" should read -- Thiessen --.

Signed and Sealed this

Ninth Day of September, 2003

JAMES E. ROGAN
*Director of the United States Patent and Trademark Office*